United States Patent [19]

Ferrier et al.

[11] Patent Number: 5,104,688
[45] Date of Patent: Apr. 14, 1992

[54] PRETREATMENT COMPOSITION AND PROCESS FOR TIN-LEAD IMMERSION PLATING

[75] Inventors: Donald R. Ferrier, Thomaston; Barry H. Williams, Oxford, both of Conn.

[73] Assignee: MacDermid, Incorporated, Waterbury, Conn.

[21] Appl. No.: 532,387

[22] Filed: Jun. 4, 1990

[51] Int. Cl.⁵ .................................................. C23C 2/00
[52] U.S. Cl. ...................................... 427/98; 427/436; 427/128
[58] Field of Search ............................ 427/98, 436, 123

[56] References Cited

U.S. PATENT DOCUMENTS

| | | | |
|---|---|---|---|
| 4,027,055 | 5/1977 | Schneble | 427/98 |
| 4,160,049 | 7/1979 | Narcus | 427/306 |
| 4,169,171 | 9/1979 | Narcus | 427/305 |
| 4,194,913 | 3/1980 | Davis | 427/98 |
| 4,234,631 | 11/1980 | Davis | 427/98 |
| 4,301,190 | 11/1981 | Feldstein | 427/97 |
| 4,321,285 | 3/1982 | Feldstein | 427/98 |
| 4,368,107 | 1/1983 | Maejima | 204/24 |
| 4,564,424 | 1/1986 | Cassat | 204/20 |
| 4,581,256 | 4/1986 | Sommer | 427/305 |
| 4,617,205 | 10/1986 | Darken | 427/305 |
| 4,666,735 | 5/1987 | Hoover | 427/98 |

FOREIGN PATENT DOCUMENTS 015741 2/1975 Japan .

OTHER PUBLICATIONS

A. F. Schmeckenbecker "Immersion Tin-Lead Plating", IBM Technical Disclosure Bulletin, vol. 18, No. 7, Dec. 1975, p. 2167.

Primary Examiner—Shrive Beck
Assistant Examiner—Vi Duong Dang
Attorney, Agent, or Firm—St. Onge Steward Johnston & Reens

[57] ABSTRACT

Metallic surfaces to be provided with a tin-lead coating from an immersion tin-lead bath, and particularly copper surfaces (e.g., through-holes, pads) of a printed circuit board having other metallic surfaces thereon covered by a hydrophobic solder mask, are prepared for receipt of immersion tin-lead coating by, e.g., contact thereof with a strongly acidic aqueous pre-dip solution containing at least one surface active agent functional to reduce the surface tension of the pre-dip solution and/or to provide the solution with improved affinity for the metallic surface.

13 Claims, No Drawings

PRETREATMENT COMPOSITION AND PROCESS FOR TIN-LEAD IMMERSION PLATING

BACKGROUND OF THE INVENTION

The present invention relates generally to the field of metal finishing, more particularly to the field of the non-electrolytic immersion coating of tin-lead on metallic surfaces, and still more particularly to the provision of tin-lead coatings on selected copper surfaces as part of the fabrication sequence in printed circuit manufacture.

It has long been known that tin and lead can be co-deposited in non-electrolytic manner over metallic substrate surfaces such as copper by means of chemical exchange/replacement reaction using aqueous acidic immersion baths containing tin and lead salts. Such processes can find use in many metal finishing applications, and are in principle particularly suitable in sequences for the fabrication of printed circuits wherein tin-lead is used as an etch resist for predetermined areas of copper circuitry and/or wherein tin-lead is applied over selected copper areas (e.g., through-holes, surrounding pads, etc.) and later reflowed to provide a solder layer for preserving and/or enhancing the solderability of those areas.

The chemical reaction mechanism of tin-lead immersion plating involves dissolution/oxidation of the metal of the substrate to be plated, which in turn brings about corresponding reduction to the metallic state, and deposition on the substrate, of the divalent tin and lead in the bath. As a consequence, the tin-lead immersion plating is not autocatalytic and it is often difficult to achieve the tin-lead layer thicknesses required in many applications. Difficulty also is encountered in achieving tin-lead deposits of desired tin/lead ratio. For example, in applications where it is desired that the deposited tin-lead layer be reflowed to provide a solder layer, it is desirable that the deposited tin/lead ratio be at or near the solder eutectic (63% tin; 37% lead), but many tin-lead immersion processes tend to provide high tin content deposits irrespective of the ratio in the bath of tin and lead ions.

In arriving at the present invention, it was found that tin-lead immersion baths which produced on copper a tin-lead deposit of acceptable thickness and tin content in certain situations (e.g., on copper-clad laminate rate panels or on boards having patterned copper on epoxy/glass laminate), nevertheless, and surprisingly, produced on copper undesirably thin tin-lead deposits, often of undesirably high tin content, in situations where the copper area was small and/or associated with surrounding areas of solder mask. This finding poses very real and practical problems, since a primary use for immersion tin-lead is in printed circuits, where small area throughholes, pads, lands, etc. are to be coated and where proximate copper traces, etc. are protected by solder mask, i.e., the very situations where the undesirable deposit characteristics are found.

SUMMARY OF THE INVENTION

It is a primary object of the invention to provide on metallic surfaces immersion tin-lead deposits of desirable thickness and desirable tin/lead content.

Another object of this invention is to provide immersion tin-lead deposits of desirable thickness and desirable tin/lead content on small area metallic surfaces and/or on metallic surfaces proximate to solder masks or other relatively hydrophobic materials.

These and other objects are achieved in the present invention, which, in its broadest aspects, involves pretreatment of the metallic surfaces which are to be immersion tin-lead plated in a manner which prepares the metallic surfaces to undergo the exchange/replacement reaction with the tin-lead bath, and produce tin-lead layers of desired thickness and tin/lead content, even when those metallic surfaces are of small area and/or are surrounded by or proximate to solder mask material and/or other hydrophobic surfaces.

As is known in the art, the metallic surfaces which are to be provided with tin-lead from a tin-lead immersion bath are generally pretreated, using what is referred to in the art as a "pre-dip", to aid in preparing the metallic surface to undergo the exchange/replacement chemical reaction with the tin-lead immersion bath components. The pre-dip is typically a strongly acidic aqueous solution. In accordance with the present invention, one or more surface active agents are included in the pre-dip, with the result that the subsequent deposition of tin-lead from a tin-lead immersion plating bath onto those pretreated metallic surfaces results in tinlead deposits of suitable thickness and tin/lead content even when the metallic surfaces in question are of small area and/or are proximate to solder masked or other relatively hydrophobic areas.

The surface active agent or agents included in the acidic pre-dip in accordance with this aspect of the invention are those which strongly reduce the surface tension of the acidic pre-dip solution and/or have strong affinity for the metallic surface to be tin-lead plated. Preferably, both functions are sought in the surface active agents, either by provision of a surface active agent which possesses both such functionalities or, as is more often the case, by using a combination of surface active agents, at least one of which strongly reduces the surface tension of the pre-dip and at least one of which has a strong affinity for the metallic surface.

The invention has particular applicability to the provision of tin-lead coatings on selected copper surfaces of a printed circuit board (e.g., the through-holes and surrounding pads) in which those areas are, in turn, surrounded by or proximate to other areas (e.g., copper traces) which have been covered by a solder mask. As is known in the art, solder masks are organic resinous materials applied to the printed circuit board in a particular pattern (e.g., by photoimaging and development) so as to cover certain areas of the board while leaving other areas exposed, such that subsequent tin-lead plating (or other means of solder application) is selective to the exposed areas. Solder masks tend to be hydrophobic, and it appears as if this hydrophobicity somehow inhibits the exposed conductive surfaces proximate thereto from receiving an immersion tin-lead layer of desired thickness and tin content. Pretreatment with the surface active agent-containing pre-dip according to the invention overcomes this inhibiting effect.

DETAILED DESCRIPTION OF THE INVENTION

The tin-lead immersion baths to which the present invention has applicability are any such baths capable of co-depositing tin and lead metal in non-electrolytic manner in an immersion process, i.e., without need for overt application of current. Generally, such baths are strongly acidic aqueous solutions containing bath-soluble sources of divalent tin and lead ions, and typically will have a pH of less than about 3, more preferably less than about 2. The requisite acidity can be brought about entirely or partly by choice of particular sources of tin and/or lead ions, e.g., through use of fluoborate salts of tin or lead which serve as sources of free fluoboric acid. Alternatively, all or part of the requisite acidity can be attained through use of acids or acidengendering materials independent of the sources of tin and/or lead. In all such cases, the acids and/or sources of tin and lead and/or any other compounds included in the bath are chosen so as not to detract from the essential functionality of the immersion bath for any particular application. For example, where tin-lead deposits having a tin/lead ratio at or near the solder eutectic are desired, it generally will be found that chloride ion tends to result in undesirably high tin content deposits, irrespective of the ratio in the bath of tin and lead ions. As such, acids such as hydrochloric acid and/or sources of tin or lead such as $SnCl_2$ or $PbCl_2$ would not generally be employed in such situations.

Most tin-lead immersion baths also will contain a complexing agent for tin and/or lead, such as thiourea, and a reducing agent, such as hypophosphite ion (e.g., from hypophosphorous acid or alkali metal (e.g., sodium) hypophosphite). Recently, however, baths have been developed which are operable without hypophosphite, using at least one weak acid and at least one weak base along with thiourea and sources of tin and lead ions in an aqueous strongly acidic medium. See concurrently-filed U.S patent application Ser. No. 532,372 of Donald Ferrier.

The tin-lead immersion baths are typically employed at elevated temperature, generally in the range of from about 160° F. to 180° F., and more typically at a temperature on the order of about 170° F. Immersion times will typically be on the order of 10 to 20 minutes.

In accordance with the invention, a pretreatment solution is employed prior to immersion of the metallic substrate in contact with the tin-lead immersion bath, and in this otherwise conventional pre-dip one or more surface active agents are included according to the invention.

The pre-dip comprises any aqueous strongly acidic solution which will be effective in preparing the metallic (e.g., copper) surface so as to enable it to readily take part in exchange/replacement reaction with the tin and lead ions of the tin-lead immersion bath. Typically, the pH of the pre-dip will be less than about 3, and more preferably less than about 2, achieved through use of one or more water-soluble acidic components. As a general rule, the acids in the pre-dip will be chosen, insofar as possible, to be generally similar to the tin-lead immersion bath components. For example, for tin-lead immersion baths using tin and lead fluoborates as sources of tin and lead ions and as sources of acidity, the pre-dip solution is conveniently arranged to utilize, e.g., fluoboric and/or boric acids as the means for achieving the requisite acidity therein. Other acceptable acids for use in the pre-dip solution include sulfuric acid, hydrochloric acid, acetic acid, formic acid, and the like, including mixtures thereof.

A particularly preferred pre-dip solution for use with tin-lead immersion baths containing tin and lead fluoborates is an aqueous solution containing from about 3 to 20 g/l boric acid and from about 0.5 to 5% by volume of fluoboric acid (referenced to a 48% aqueous solution of the fluoboric acid as the source therefor; obviously, the optimum volumetric percentage in the pre-dip will differ if more or less concentrated source solutions of fluoboric acid are employed).

In the invention, one or more surface active agents are also included in the pre-dip solution. The particular type of surface active agent employed will, in the first instance, be subject to the practical criterion that it be operable in strongly acidic aqueous solutions, and more specifically operable in and compatible with the particular acids in the pre-dip. Beyond this requirement, the choice of particular surface active agent and its level of use in the pre-dip in predicated upon the functional criteria of enabling the metallic surface in question to receive a tin-lead coating of desired thickness and tin content from a tin-lead immersion bath, even when the metallic surface is of small surface area and/or is surrounded by or proximate to a relatively hydrophobic surface (e.g., a solder mask, certain insulating substrates and the like).

More particularly, one choice for the type of surface active agent, and for its level of use in the pre-dip, are those surface active agents which strongly reduce the surface tension of the pre-dip solution per se (i.e., as compared to the same pre-dip solution without such surface active agent), rendering it more readily capable of wetting out on the metallic surface and overcoming the resistance to such wetting out which seems to be associated with small metallic surface areas and/or proximately located hydrophobic areas.

Another choice for the type of surface active agent, and for its level of use in the pre-dip, are those surface active agents which exhibit a strong binding affinity for the metallic surface in question, e.g., copper. In this manner, the pre-dip solution into which the overall work is immersed itself exhibits strong and preferential affinity for the metallic surface, overcoming the resistance to such affinity found when the metallic surfaces are small in area and/or proximate to hydrophobic surfaces.

In the most preferred embodiment of the invention, it is desirable to choose the surface active agents, and their level of use, such that both effects are attained, i.e., such that the surface tension of the pre-dip is reduced and such that the pre-dip exhibits strong affinity for the metallic surface. In certain situations it may be possible to choose a single surface active agent to achieve these two effects, but it is more often the case that two different surface active agents will be employed, each being largely responsible for obtaining one of the desired effects.

In all such circumstances, one or more surface active agents can be employed to bring about any one or both of the desired functional effects.

The choice of surface active agents effective to bring about the desired functional properties in the predip solution, i.e., reduction of the surface tension of the pre-dip and/or strong affinity for the metallic substrate surface (typically copper), is potentially very wide-ranging. For example, surface active agents effective to reduce the surface tension of the acidic pre-dip solution include nonionic surfactants (e.g., ethoxylated octyl or nonyl phenols; polyoxyethylene lauryl alcohols; ethoxylated straight chain alcohols; nonionic fluorochemical surfactants), anionic surfactants (e.g., sodium xylene sulfonates; sodium lauryl ether sulfates; alkyl naphthalene sodium sulfates; anionic fluorochemical surfactants; sodium alkyl aryl sulfonates); and cationic/ amphoteric agents, which in certain situations combine surface tension reduction capability with affinity to metal capability (e.g., coconut derivatives of 2-pyrazoline; dicarboxylic caprylic, disodium; ethoxylated coco amines). Agents effective to promote strong affinity of the pre-dip solution to the metallic surfaces being treated can be selected from the class of surface active agents generally referred to in the art as inhibitors, such as the keto-amines, quaternary ammonium chloride, aliphatic amines, cationic surfactant blends, and the like.

The surface active agents need be employed only at relatively low levels in the pre-dip solution in order to obtain the desired benefits therefrom, generally on the order of from about 0.01 to about 5 g/l, more preferably from about 0.05 to about 0.5 g/l, and most preferably from about 0.1 to about 0.2 g/l, with particular amounts depending upon the particular surface active agent, the metallic surface being treated, the area of the metallic surface and/or the extent of proximate hydrophobic areas, and the like.

The pre-dip solution according to the invention is typically employed at about room temperature, and immersion time therein for the metallic surfaces in question are generally on the order of 1 to 5 minutes. As a general rule, there will be no rinsing between this pre-dip and immersion in the tin-lead bath.

The metallic surfaces which are contacted with the pre-dip solution typically will be treated even before that step to insure clean surfaces and/or to effect micro-etching of the metallic surface, all as well known in the art.

As previously noted, the invention has particular application in fabrication sequences for printed circuits, and especially for those sequences where a tinlead layer is to be reflowed to provide solder on selected areas of the printed circuit. Fabrication sequences for printed circuits are, of course, well known in the art and typically might include through-hole containing copper-clad insulating substrates as starting material, followed by metallization of through holes, application of patterned plating resist, plating with electrolytic copper, application of etch-resistant material (e.g., immersion tin-lead) over copper areas, removal of plating resist, etching away the copper, which was under the plating resist, down to the substrate, application of solder mask to preselected remaining metallized areas (e.g., conductive traces), and reflow of the tin-lead areas not protected by solder mask. There are, of course, numerous variations on this sequence, including those of particular importance for the invention herein, where the tin-lead layer to be reflowed is applied by an immersion tin-lead bath and only after solder mask has been applied to selected bare copper areas. Because the invention provides a means for production of tin-lead layers of suitable thickness and tin/lead ratio, one of the significant advantages is that the desired provision of solder on selected areas can be brought about solely by reflow of this tin-lead deposit, without need for subsequent resort to other soldering techniques (e.g., hot air solder levelling).

The invention and the findings underlying it, are further described and illustrated with reference to the following examples.

EXAMPLE I

A copper-clad laminate panel (surface area approximately 12in$^2$) was micro-etched by immersing it in a micro-etchant solution (Metex G-4 Micro-Etch, MacDermid, Inc., Waterbury, Connecticut) for two minutes at a solution temperature of about 70°-90° F. The panel was then rinsed and immersed in a room temperature pre-dip solution containing 2% by volume of 48% fluoboric acid and 6 g/l boric acid, and thereafter, without rinsing, was immersed in a 170° F. tin-lead immersion plating bath, containing thiourea, hypophosphite and tin and lead fluoborates, for 10 minutes. The tin-lead deposited over the copper had an average thickness of about 0.25 mils (6 microns), with measured thicknesses in the range of 0.16 to 0.28 mils (4 to 7 microns), and an average tin weight percent of 68%.

EXAMPLE II

Example I was identically repeated with the exception that instead of the copper-clad laminate panel, the substrate instead was a copper patterned printed circuit board in which the copper traces were covered by a cured organic hydrophobic solder mask while the copper through-holes and surrounding pads were not so covered. The tin-lead plating on these exposed copper areas had an average thickness of only about 0.09 mils (2 microns), with measured thicknesses in the range of 0.06 to 0.16 mils (1.5 to 4 microns), and an average tin content of 68% by weight.

EXAMPLE III

The procedures and compositions of Examples I and II were identically employed to process both copper-clad laminate panels and copper patterned printed circuit boards having solder mask, with the sole exception being that one or more surfactants was added to the pre-dip solution.

Table I sets forth the results obtained for average tin-lead thickness, thickness range, and tin content, for the seventeen (17) runs made.

TABLE I

| Surface Active Agent | Conc. | Plate Time | Copper Panel Thickness | Range | Tin % | SolderMask Panel Thickness | Range | Tin % |
|---|---|---|---|---|---|---|---|---|
| Miranol CM Conc[1] | 0.25 g/l | 10 min. | — | — | — | 0.16 mils | (0.08–0.28) | 57% |
| Miranol CM Conc | 0.45 g/l | 10 min. | — | — | — | 0.20 mils | (0.08–0.38) | 60% |
| Rodine 213[2] | 0.2 g/l | 10 min. | 0.21 mils | (0.15–0.25) | 68% | 0.18 mils | (0.09–0.47) | 61% |
| Sipon ES-2[3] | 0.2 g/l | 10 min. | 0.21 mils | (0.15–0.30) | 58% | 0.19 mils | (0.05–0.31) | 48% |
| Sipon ES-2 | 0.5 g/l | 20 min. | 0.39 mils | (0.22–0.65) | 52% | 0.38 mils | (0.19–0.90) | 41% |
| Sipon ES-2 Rodine 213 | 0.5 g/l plus 0.1 g/l | 20 min. | 0.34 mils | (0.17–0.58) | 63% | 0.45 mils | (0.26–0.56) | 63% |
| Sipon ES-2 Rodine 213 | 0.1 g/l plus 0.1 g/l | 10 min. | 0.27 mils | (0.17–0.41) | 72% | 0.26 mils | (0.16–0.43) | 77% |
| FC-95[4] | 0.1 g/l | 10 min. | 0.24 mils | (0.18–0.31) | 70% | 0.20 mils | (0.09–0.41) | 63% |
| FC-95 | 0.1 g/l | 20 min. | 0.30 mils | (0.25–0.37) | 68% | 0.18 mils | (0.11–0.29) | 67% |
| FC-95 | 0.1 g/l plus | 10 min. | 0.21 mils | (0.13–0.28) | 66% | 0.32 mils | (0.27–0.49) | 63% |

TABLE I-continued

| Surface Active Agent | Conc. | Plate Time | Copper Panel Thickness | Range | Tin % | SolderMask Panel Thickness | Range | Tin % |
|---|---|---|---|---|---|---|---|---|
| Rodine 213 | 0.1 g/l | | | | | | | |
| FC-95 | 0.1 g/l | 20 min. | 0.26 mils | (0.15–0.38) | 63% | 0.33 mils | (0.16–0.45) | 59% |
| plus | | | | | | | | |
| Rodine 213 | 0.1 g/l | | | | | | | |
| FC-98[5] | 0.1 g/l | 10 min. | 0.17 mils | (0.10–0.23) | 68% | 0.14 mils | (0.07–0.33) | 55% |
| Triton X-100[6] | 0.5 g/l | 10 min. | 0.24 mils | (0.13–0.32) | 70% | 0.13 mils | (0.10–0.23) | 76% |
| Zonyl FSN[7] | 0.3 g/l | 10 min. | 0.21 mils | (0.16–0.30) | 72% | 0.09 mils | (0.05–0.20) | 78% |
| Miranol CM Conc | 0.1 g/l | 20 min. | 0.37 mils | (0.21–0.54) | 68% | 0.45 mils | (0.25–0.55) | 69% |
| plus | | | | | | | | |
| FC-95 | 0.1 g/l | | | | | | | |
| Miranol CM Conc | 0.1 g/l | 20 min. | 0.33 mils | (0.25–0.42) | 65% | 0.22 mils | (0.09–0.41) | 63% |
| plus | | | | | | | | |
| Rodine 213 | 0.1 g/l | | | | | | | |
| Miranol CM Conc | 0.1 g/l | 20 min. | 0.31 mils | (0.25–0.37) | 79% | 0.40 mils | (0.31–0.51) | 73% |
| plus | | | | | | | | |
| Rodine 213 | 0.1 g/l | | | | | | | |
| plus | | | | | | | | |
| FC-95 | 0.1 g/l | | | | | | | |

Footnotes to Table I:
[1]Miranol CM Conc. - Amphoteric Coconut derivative of 2-pyrazoline (Miranol, Incorporated)
[2]Rodine 213 - Keto-Amine acid inhibitor (Amchem Inc.)
[3]Sipon ES-2 - Anionic Sodium Lauryl Ether Sulfate (Alcolac, Inc.)
[4]FC-95 - Anionic Fluorochemical Surfactant (3 M Corporation)
[5]FC-98 - Anionic Fluorochemical Surfactant (3 M Corporation)
[6]Triton X-100 - Nonionic Ethoxylated Octyl Phenol Surfactant (Rohm & Hass Company)
[7]Zonyl FSN - Nonionic Fluorochemical Surfactant (DuPont Corporation)

A scan be seen from Table I, certain surface active agents or combinations thereof bring about substantially improved plating thickness as compared to thicknesses obtained using pre-dips without surface active agents, even in situations where the surface being tinlead coated is a relatively large unencumbered surface (i.e., copper-clad laminate panel). More importantly, significantly improved thickness is attained in tin-lead deposits on the troublesome small copper areas proximate to hydrophobic solder mask areas, as compared to results obtained using pre-dips with no surface active agents, and generally speaking there is correspondence between the copper panel and solder masked panel in terms of plating thicknesses and tin contents.

Although the invention has been described with reference to particular examples and embodiments, the particulars thereof are not intended to be limiting of the scope of the invention except to the extent recited in the appended claims.

What is claimed is:

1. In a process for providing an immersion tin-lead coating on selected metallic surfaces of a work object, wherein the metallic surfaces are treated with a strongly acidic aqueous pre-dip solution containing fluoboric acid to prepare them for the immersion tin-lead coating, and are thereafter immersed in a strongly acidic aqueous tin-lead immersion plating bath for a time and at conditions effective to deposit a coating of tin-lead on said metallic surfaces, the improvement comprising including in said strongly acidic aqueous pre-dip solution an effective amount of at least one surface active agent functional to reduce the surface tension of said pre-dip solution and/or to provide said pre-dip solution with greater affinity for said metallic surfaces, all as compared to a pre-dip solution without said surface active agent.

2. A process according to claim 1 wherein said metallic surfaces are comprised of copper.

3. A process according to claim 2 wherein said work object is a printed circuit board having a copper pattern thereon.

4. A process according to claim 3 wherein said work object is a printed circuit board having a copper pattern thereon; wherein selected areas of said copper pattern are covered by a hydrophobic organic solder mask; and wherein said preselected copper surfaces to be immersion coated with tin-lead are not covered by, but are proximate to, said solder-masked areas.

5. A process according to either claim 1 or claim 4 wherein said surface active agent is functional to reduce the surface tension of said pre-dip solution.

6. A process according to either claim 1 or claim 4 wherein said surface active agent is one having a strong affinity for copper.

7. A process according to either claim 1 or claim 4 wherein at least two surface active agents are employed, one functional to reduce the surface tension of said pre-dip solution and one having a strong affinity for copper.

8. A process according to either claim 1 or claim 4 wherein said surface active agent is present in said pre-dip solution in an amount from about 0.01 g/l to about 5 g/l.

9. A process according to either claim 1 or claim 4 wherein said tin-lead immersion plating bath contains tin fluoborate and lead fluoborate.

10. In a process for providing an immersion tin-lead coating on selected metallic surfaces of a work object, wherein the metallic surfaces are treated with a strongly acidic aqueous pre-dip solution to prepare them for the immersion tin-lead coating, and are thereafter immersed in a strongly acidic tin-lead immersion plating bath for a time and at conditions effective to deposit a coating of tin-lead on said metallic surfaces, the improvement comprising including in said strongly acidic aqueous pre-dip solution an effective amount of at least one surface active agent serving a function selected from the group consisting of (a) improving the affinity of said pre-dip solution for said metallic surfaces, and (b) reducing the surface tension of said pre-dip solution and improving the affinity of said pre-dip solution for said metallic surfaces, all as compared to a pre-dip solution without said surface active agent.

11. In a pre-dip for preparing selected metallic surfaces of a work object for immersion tin-lead coating from a strongly acidic tin-lead immersion plating bath, said pre-dip comprising a strongly acidic aqueous solution effective to prepare said metallic surfaces for undergoing the exchange/replacement reaction with components of the tin-lead immersion plating bath so as to deposit a coating of tin-lead therefrom, the improvement selected for the group consisting of (a) including in said pre-dip solution fluoboric acid and an effective amount of at least one surface active agent functional to reduce the surface tension of said pre-dip solution and/or to provide said pre-dip solution with greater affinity for said metallic surfaces, all as compared to a pre-dip solution without said surface active agent and (b) including in said pre-dip solution an effective amount of at least one surface active agent serving a function selected from the group consisting of (1) improving the affinity of said pre-dip solution for said metallic surfaces, and (2) reducing the surface tension of said pre-dip solution and improving the affinity of said pre-dip solution for said metallic surfaces, all as compared to a pre-dip solution without said surface active agent.

12. A pre-dip according to claim 11 wherein the pH thereof is less than about 3.

13. A pre-dip according to claim 12 containing fluoboric acid.

* * * * *